United States Patent [19]
Hovis

[11] Patent Number: 5,893,927
[45] Date of Patent: Apr. 13, 1999

[54] MEMORY DEVICE HAVING PROGRAMMABLE DEVICE WIDTH, METHOD OF PROGRAMMING, AND METHOD OF SETTING DEVICE WIDTH FOR MEMORY DEVICE

[75] Inventor: William Paul Hovis, Rochester, Minn.

[73] Assignee: International Business Machines Corporation, Armonk, N.Y.

[21] Appl. No.: 08/713,640

[22] Filed: Sep. 13, 1996

[51] Int. Cl.[6] .......................... G06F 12/02; G06F 13/16
[52] U.S. Cl. .................. 711/171; 711/172; 711/102; 711/103; 711/105
[58] Field of Search ........................ 711/105, 103, 711/170, 172, 171, 102; 395/307

[56] References Cited

U.S. PATENT DOCUMENTS

| | | | |
|---|---|---|---|
| 4,663,729 | 5/1987 | Matick et al. | 345/515 |
| 5,333,294 | 7/1994 | Schnell | 395/846 |

*Primary Examiner*—Reginald G. Bragdon
*Attorney, Agent, or Firm*—Gary Yacura; Birch, Stewart, Kolasch & Birch

[57] ABSTRACT

A memory device having a programmable device width includes a storage unit, output logic, at least one register, control logic, decode logic and configuration logic. The output logic outputs data from the storage unit based on control signals and address data received on address inputs. The register stores device width data under the control of the control logic. The control logic receives command data, and generates the control signals based on the command data. Additionally, the control logic controls the storage operation of the register based on the command data. The decode logic decodes the device width data to determine a desired device width, and the configuration logic configures the output logic so that the memory device has the desired device width. By supplying command data to the control logic such that the control logic causes the register to store device width data and supplying device width data representing a desired device width to the register, a user can program the device width of the memory device without having to rely on the manufacturer producing memory devices of different device widths.

59 Claims, 10 Drawing Sheets

A7 - Test mode    0 - enables 'normal' mode register set cmd
                 1 - enables test mode A8 - reserved    0 - enables 'normal' mode register set cmd
                1 - not allowed A9 - write mode    0 - burst read & burst write
                  1 - burst read & single write A10 - reserved    0 - enables 'normal' mode register set cmd
                 1 - not allowed BA0 - reserved    0 - enables 'normal' mode register set cmd
                 1 - not allowed BA1 - reserved    0 - enables 'normal' mode register set cmd
                 1 - not allowed A7 - Test mode         0 - enables 'normal'
                           mode register set cmd
                       1 - enables test mode A8 - Device Width      0 - enables 'normal'
                           mode register set cmd
                       1 - x4

A9 - write mode        0 - burst read & burst write
                       1 - burst read & single write A10 - Device Width     0 - enables 'normal'
                           mode register set cmd
                       1 - x8

BA0 - Device Width     0 - enables 'normal'
                           mode register set cmd
                       1 - x16

BA1 - reserved         0 - enables 'normal'
                           mode register set cmd
                       1 - not allowed

FIGURE 4B

Register Set Address

A8  \
A10  --- Device width
BA0  /

Encode meaning

A8A10BA0

000 - x4
001 - x8
010 - x16
011 - x32
100 - x64
101 - x128
110 - reserved
111 - reserved

MEMORY DEVICE HAVING PROGRAMMABLE DEVICE WIDTH, METHOD OF PROGRAMMING, AND METHOD OF SETTING DEVICE WIDTH FOR MEMORY DEVICE

BACKGROUND OF THE INVENTION

1. Field of the Invention

The present invention relates to a memory device; and more particularly, to a memory device having a programmable device width, a method of programming the device width, and a method of setting a device width for a memory device.

2. Description of Related Art

In today's electronic manufacturing environment, many unique parts are required for both suppliers and consumers of electronic components. This is particularly true among memory components which comprise a large percentage of the overall system/device cost. With memory devices, the major part differentiators include access time, reliability grade, function, and device width.

For example, with respect to device width, a 16 Mb dynamic random access memory DRAM may come configured as either a 4 Mb×4, 2 Mb×8, 1 Mb×16, 512 Kb×32, etc. With a 4 Mb×4 configuration, the 16 Mb memory device is divided into four memory blocks of 4 Mb each, and has one input/output I/O corresponding to each memory block. Accordingly, when listing memory devices, a different part number is required for each memory device having a different device width.

Manufacturers of such memory devices produce a die which can operate as a ×1, ×4, ×8, etc., device. Some manufacturers then set the device width of the die during the final metalization stages of the die's manufacture. Other manufacturers use different die packages to set the device width through wire bonding as described in detail below.

FIG. 1 illustrates a well known synchronous dynamic random access memory SDRAM with the device width set according to the well known wire bond option technique. As shown in FIG. 1, the SDRAM includes a clock generator 2 which outputs clock signals to various components of the SDRAM to synchronize the operation thereof. A command decoder 4 of the SDRAM receives a chip select $\overline{CS}$, row enable $\overline{RAS}$, column enable $\overline{CAS}$ and write command $\overline{W}$ inputs. As shown in FIG. 1, the command decoder 4 recognizes, for example, a write command when $\overline{CS}$, $\overline{CAS}$, and $\overline{W}$ are asserted, i.e., logic low, at the same time. The command decoder 4 outputs the command to the control logic 6 which controls the operation of the other components of the SDRAM based on the received command.

Besides the commands of $\overline{CS}$, $\overline{RAS}$, $\overline{CAS}$ and $\overline{W}$, the command decoder 4 can also recognize other commands based on a combination of $\overline{CS}$, $\overline{RAS}$, $\overline{CAS}$ and $\overline{W}$. For instance, the command decoder 4 decodes the simultaneous receipt of $\overline{CS}$, $\overline{RAS}$, $\overline{CAS}$ and $\overline{W}$ as a mode register set command.

When a mode register set command is received, the control logic 6 causes a mode register 8 to latch the address data on address inputs A0–A10 and BA0–BA1. The data on address inputs A0–A10, generally, represent either a row or column address and the data on address inputs BA0–BA1, generally, represent a bank address. The bank addresses inputs BA0–BA1 specify one of the memory banks A–D discussed in detail below. During the mode register set operation, however, the data on address inputs A0–A10 and

2

BA0–BA1 do not represent addresses. Hereinafter, the address inputs and the data thereon will generically be referred to as address inputs.

FIG. 2 illustrates a table showing the current Joint Electron Device Engineering Council (JEDEC) standard 21-C version 6 encodation definition for each address input during the mode register set operation. As shown in FIG. 2, address inputs A0–A2 set the burst length, address input A3 sets the addressing mode, address inputs A4–A6 set the CAS latency, address input A7 enables a test mode, address inputs A8, A10, and BA0–BA1 are reserved for future use, and address input A9 sets the write mode. The control logic 6 then controls the components of the memory device according to these settings. Accordingly, like $\overline{CS}$, $\overline{RAS}$, $\overline{CAS}$, and $\overline{W}$, the data supplied on the address inputs during the mode register set operation are also command data.

Returning to FIG. 1, the SDRAM includes a row address buffer and refresh counter 10 and a column address buffer and burst counter 12 connected to the address inputs. The row address buffer portion latches the address inputs at RAS time, $\overline{RAS}$ enabled, and provides the address data to the appropriate row decoder 14. The refresh counter portion refreshes the chip. The column address buffer portion latches the address inputs at CAS time, $\overline{CAS}$ enabled, and provides the address data to the appropriate column decoder 18. The burst counter portion controls the reading/writing of more than one column based on the pre-set burst length.

The memory 22 of the SDRAM is divided into four memory banks A–D. In this manner, the memory banks A–D can be independently and simultaneously selected. Each memory bank A–D has associated therewith a row decoder 14, a sense amplifier 16 and a column decoder 18. Based on the address latched by the row address buffer and refresh counter 10, a row decoder 14 enables a row of bits. An associated sense amplifier 16 latches the columns of this row via sense amplification, and the associated column decoder 18 outputs one or more bits depending on the device width and burst length.

The SDRAM includes configuration logic 28 for setting the device width. The configuration logic 28 includes a plurality of program pads. When the SDRAM die is packaged, the packaging internally wire bonds the programs pads to either an input voltage VDD pin or a ground pin. Based on these connections, which set the logic state for each program pad, the configuration logic 28 configures the data control circuit 20, a latch circuit 24 and an input/output buffer 26 to obtain the device width associated with the logic states of the program pads. Specifically, the configuration logic 28 controls the switches and multiplexers in a data control circuit 20 such that the number of input/output drivers corresponds to the device width. For example, if the configuration logic 28 configures the data control circuit 20 to a ×8 device width, the data control logic 20 will have eight input/output drivers. Likewise, the packaging will include eight I/O pins DQ0–DQ7. Accordingly, the configuration logic 28 configures the latch circuit 24 and the input/output buffer 26 to latch and buffer data between the eight I/O pins DQ0–DQ7 and the corresponding eight input/output drivers of the data control circuit 20.

The data control circuit 20 is connected to each column decoder 18, and is connected to data input/output pin(s) DQ(s) via the latch circuit 24 and the input/output buffer 26. During a read operation, the column decoders 18 output data to the data control circuit 20 based on the enabled row, the enable column, and the burst length. The data control circuit 20 then routes the data to the number of input/output drivers set based on the device width. The data from the input/output drivers is latched by the latch circuit 24, buffered by the input/output buffer 26 and output on the data input/output pin(s) DQ(s). As alluded to above, the number of input/output pin(s) DQ(s) corresponds to the device width. For instance if the device width is ×1, then configuration logic 28 will have configured the data control circuit 20 to have a single input/output driver and the packaged SDRAM will have a single input/output pin DQ. Or, if the device width is ×4, then the configuration logic 28 will have configured the data control circuit 20 to have four input/output drivers and the packaged SDRAM will have four input/output pins DQ0–DQ3.

During a write operation, the SDRAM receives data over the input/output pin(s) DQ(s). This data is buffered by the input/output buffer 26, latched by the latch circuit 24, and received by the data control circuit 20. The data control circuit 20 sends the data to the appropriate column decoders 18 for storage in the memory banks A–D according to the enabled row and column.

The SDRAM also includes an input DQM to the latch circuit for every 8 bits of input/output. For instance a ×16 SDRAM will have two inputs DQM0 and DQM1. When enabled, the input DQM prevents reading or writing the remainder of a burst. In this manner, the burst length can be controlled.

As the discussion above indicates, the device width of a memory device is set during the final metalization of the memory die or by internal connections made during packaging of the die. While these two techniques of setting device width have been discussed above in detail with respect to SDRAMs, these techniques are also used to set the device width of DRAMs, read only memories ROMs, programmable read only memories PROMs, erasable programmable read only memories EPROMs, electrically erasable read only memories EEPROMs, etc.

At least one manufacturer, however, has pinned out the program pads by adding additional pins to the memory device package. The resulting device, however, did not meet JEDEC standards, and therefore, little or no demand exists for such products. Accordingly, manufacturers producing memory devices for the commercial market utilize either the final metalization technique or the bonding option technique to set device width.

While using these techniques provides the manufacturer with the flexibility to choose the device width, consumers must wade through the manufacturer's long lists of part numbers to find the particular memory device having the device width desired. For consumers wanting to purchase relatively unpopular types of memory devices, this only begins the arduous journey of obtaining a memory device of a desired device width. Typically, manufacturers will allocate more production runs to those memory devices having device widths which are in greater demand. Consequently, a consumer seeking a less popular memory device often finds theses devices out-of-stock, and must wait for the manufacturer to make a production run of that memory device.

SUMMARY OF THE INVENTION

It is an object of the present invention to provide a memory device which overcomes the drawbacks of conventional memory devices.

It is a further object of the present invention to provide a memory device having a programmable device width.

It is another object of the present invention to provide a memory device having a user selectable device width which complies with JEDEC standards.

It is yet another object of the present invention to provide a method of programming a memory device having a programmable device width.

Also an object of the present invention is to provide a method of setting a device width of a memory device.

These and other objects of the present invention are achieved by providing a memory device having a programmable device width that includes a storage unit, output logic, at least one register, control logic, decode logic and configuration logic. The output logic outputs data from the storage unit based on control signals and address data received on address inputs. The register stores device width data under the control of the control logic. The control logic receives command data, and generates the control signals based on the command data. Additionally, the control logic controls the storage operation of the register based on the command data. The decode logic decodes the device width data to determine a desired device width, and the configuration logic configures the output logic so that the memory device has the desired device width.

These and other objects of the present invention are further achieved by providing a method of programming the above discussed memory device. The method includes the steps of supplying command data to the control logic such that the control logic causes the register to store device width data, and supplying device width data representing a desired device width to the register.

These and other objects of the present invention are additionally achieved by providing a method of setting a device width of a memory device which includes storage means for storing data, output means for outputting data from the storage means based on control signals and address data received on address inputs, and a register means for at least storing device width data. The method includes the steps of receiving command data, generating the control signals based on the command data, and controlling the register means to store the device width data based on the command data. The method further includes the steps of decoding the device width data to determine a desired device width, and configuring the output means so that the memory device has the desired device width.

Other objects, features, and characteristics of the present invention; methods, operation, and functions of the related elements of the structure; combination of parts; and economies of manufacture will become apparent from the following detailed description of the preferred embodiments and accompanying drawings, all of which form a part of this specification, wherein like reference numerals designate corresponding parts in the various figures.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5 illustrates an example of indirect encodation of the device width;

DETAILED DESCRIPTION OF THE PREFERRED EMBODIMENTS

Figure 1:
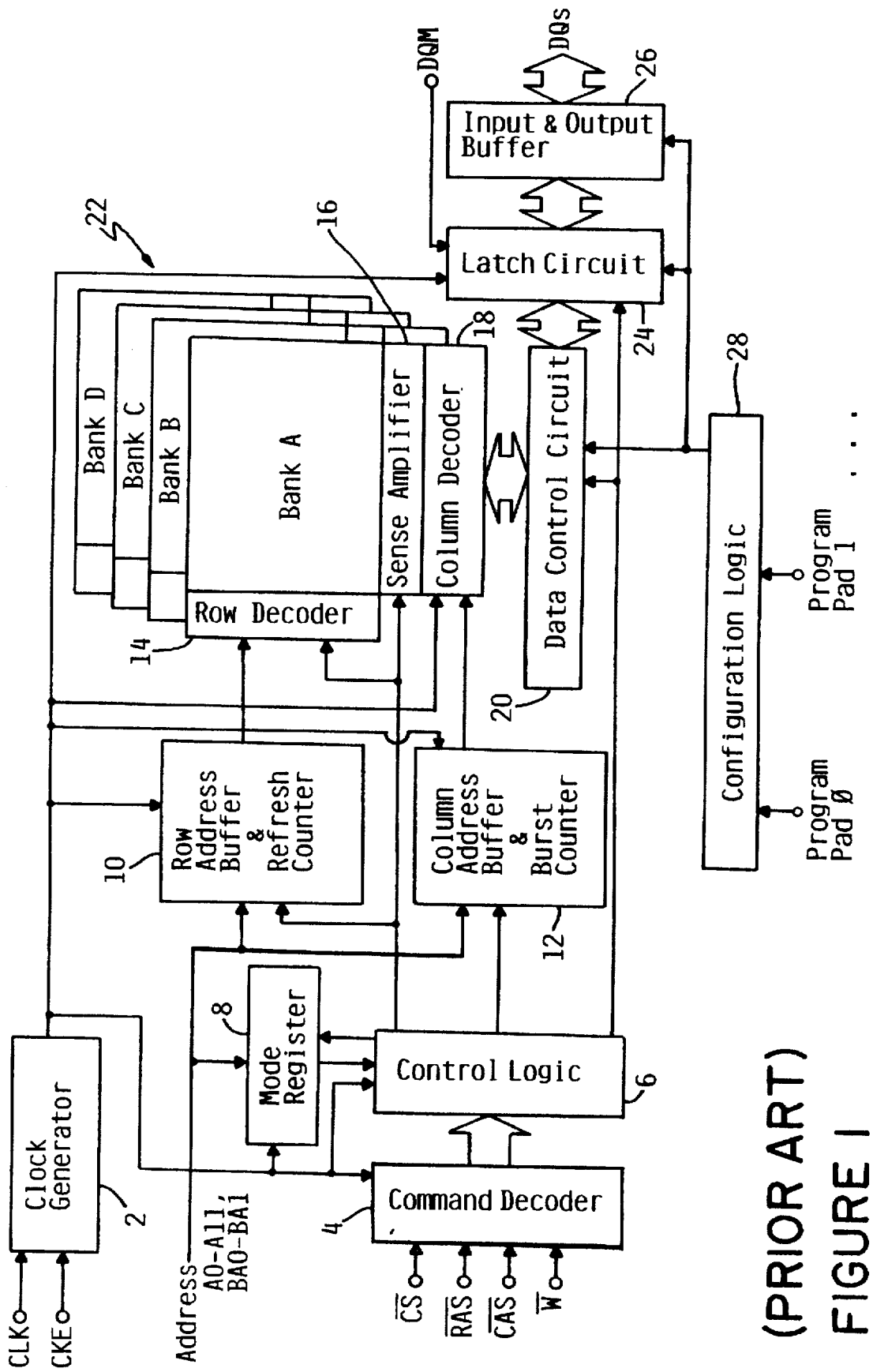
FIG. 1 illustrates a well known synchronous dynamic random access memory SDRAM with the device width set according to the well known wire bond option technique.
Figure 3:
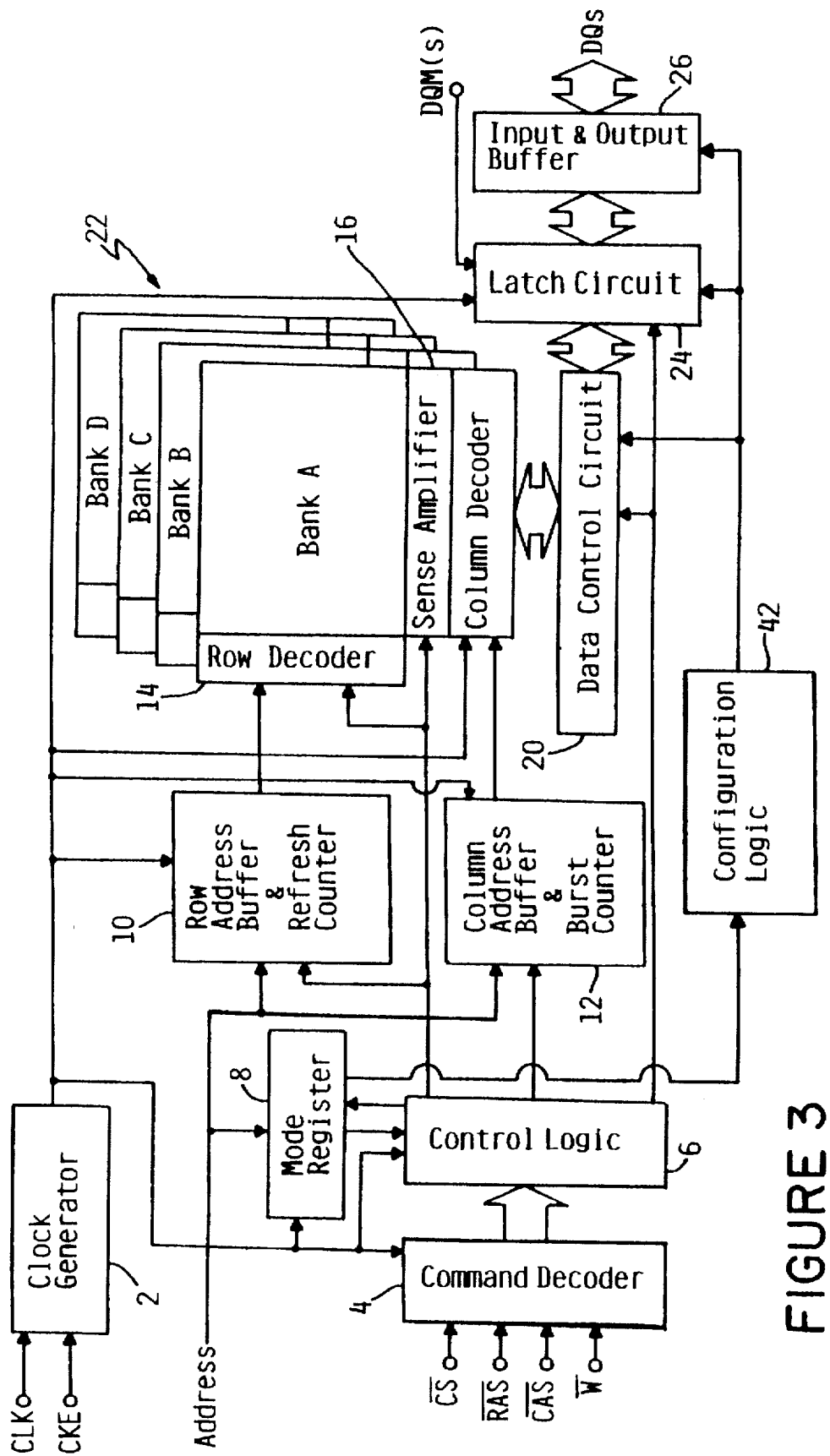
FIG. 3 illustrates an SDRAM according to the present invention having a programmable device width.

FIG. 3 illustrates an SDRAM having a programmable device width according to one embodiment of the present invention. The SDRAM illustrated in FIG. 3 is the same as the SDRAM illustrated in FIG. 1 except that the configuration logic 28 has been replaced by configuration logic 42 which is connected to not only the data control circuit 20, the latch circuit 24, and the I/O buffer 26, but also to the mode register 8. Accordingly, the SDRAM of FIG. 3 functions in the same manner as discussed above with respect to the SDRAM of FIG. 1 except for the setting of the device width.

The operation of setting the device width according to the present invention will now be described. According to a first method of operation, and referring to the address input encodation definitions for the mode register set operation illustrated in FIG. 2, the reserved address inputs A8, A10, and BA0-BA1 are used to set the device width. Either each address input stands for a specific device width, namely direct encodation, or the combination of these address inputs represents a specific device width, namely indirect encodation.

Figure 4A:
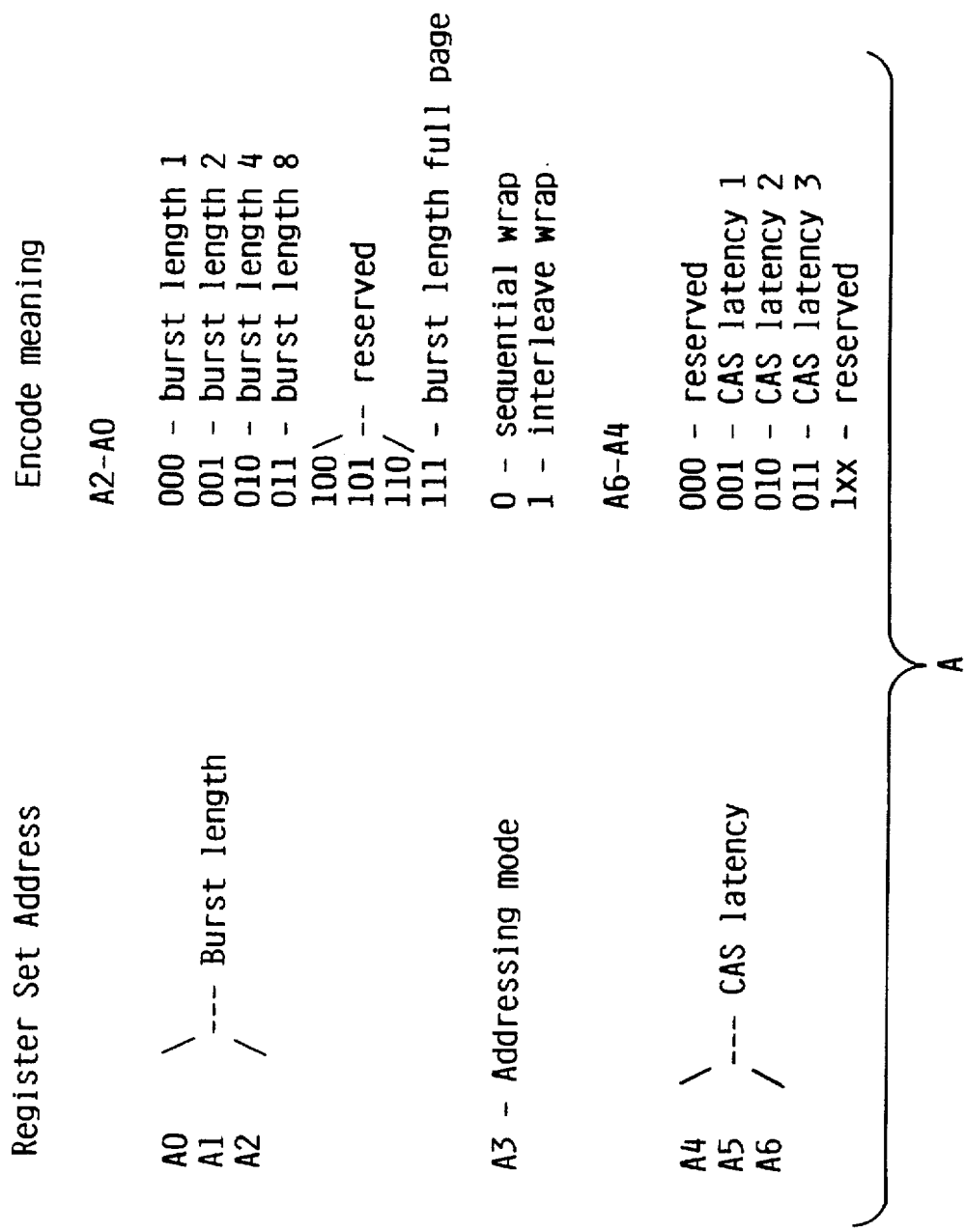
FIG. 4 illustrates an example of direct encodation of the device width.

FIG. 4 illustrates one example of direct encodation. As shown in FIG. 4, address input A8 sets a device width of ×4, address input A10 sets a device width of ×8, and address input BA0 sets a device width of ×16. In this example the address input BA1 remains reserved for future use. In the direct encodation embodiment, the configuration logic 42 inputs the address inputs stored in the mode register 8, decodes the address inputs according to, for example, the predetermined device width encodation definitions shown in FIG. 4, and based on the device width enabled by the address inputs, configures the device width accordingly. This configuration is performed in the same manner as discussed above with respect to the configuration logic 28.

FIG. 5 illustrates one example of indirect encodation. As illustrated in FIG. 5, device widths of ×4, ×8, . . . , ×128 can be encoded in this manner. As with the direct encodation example of FIG. 4, address input BA1 remains reserved for future use. When using the indirect encodation definitions of FIG. 5, the pattern A8,A10,BA0 represents a code. The configuration logic 42 inputs the address inputs stored by the mode register 8, decodes the address inputs according to the predetermined device width encodation definitions shown in FIG. 5, and based on the device width enabled by the address inputs, configures the device width accordingly. This configuration is performed in the same manner as discussed above with respect to the configuration logic 28. It is to be understood that FIGS. 4 and 5 are only examples of direct and indirect encodation definitions, and that many other direct and indirect encodation definitions are possible.

Figure 2:
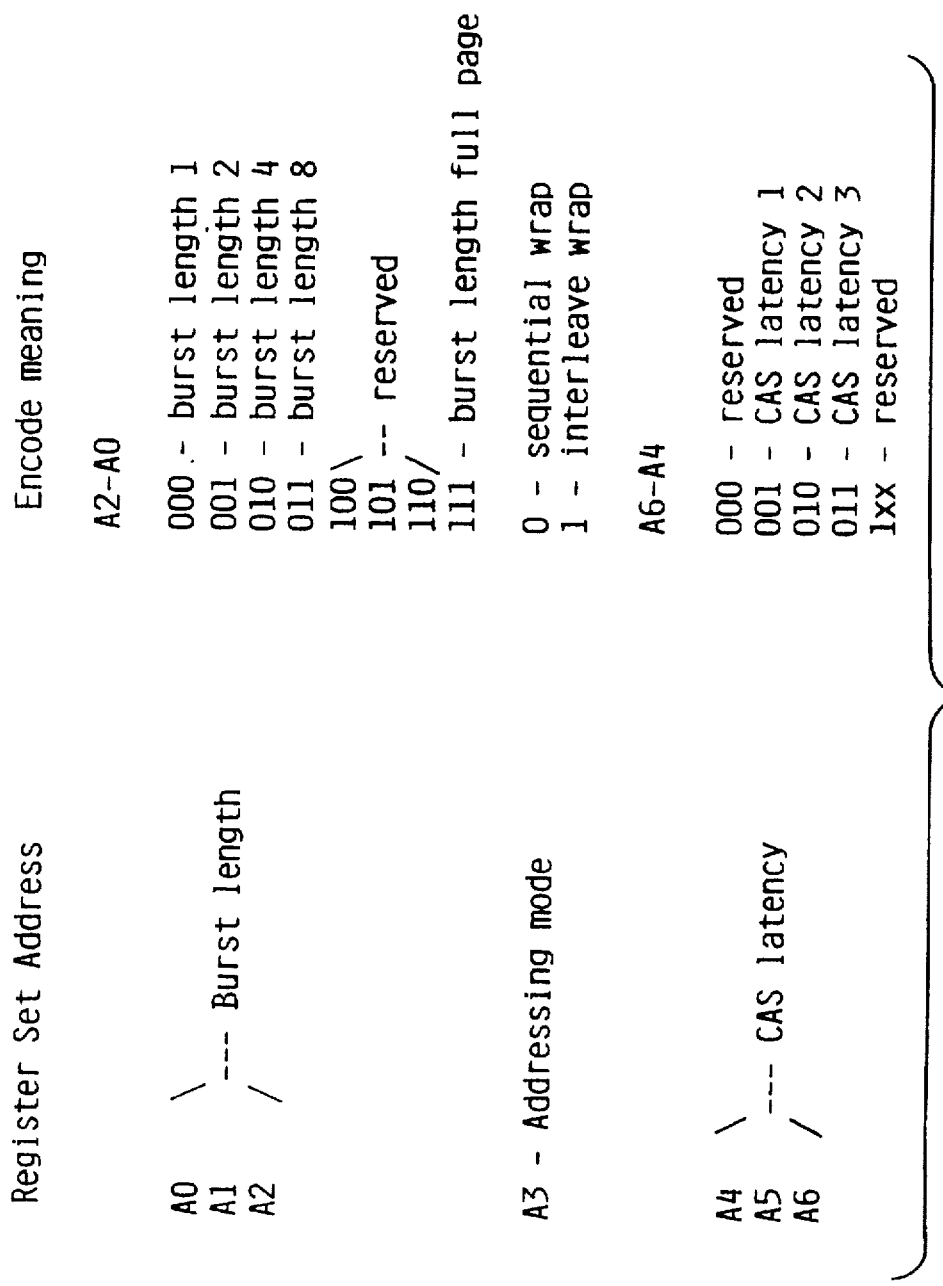
FIG. 2 illustrates a table showing the input Joint Electron Device Engineering Council (JEDEC) definition for each address input of the SDRAM during the mode register set operation.

A second method of operation will now be described. Referring back to FIG. 2, the address inputs A0-A6 only have the encodation definitions shown when the address input A7 enables 'normal' mode register set operation. If the address input A7 enables the test mode, however, the address inputs are not given the encode meaning as shown in FIG. 2. Using one of the address inputs A8, A10, and BA0-BA1, a 'normal' mode register set mode or a device width set mode can be enabled. When the 'normal' mode register set mode is enabled, the address inputs have the encodation definitions shown in FIG. 2. If the device width set mode is enabled, however, then address inputs are not given the encode meaning as shown in FIG. 2. Instead, the address inputs other than A7 and the one of A8, A10, and BA0-BA1 enabling the device width set mode are used to directly or indirectly encode the device width. For example, address inputs A0-A2 are used to directly or indirectly encode the device width in the same manner illustrated in FIGS. 4-5 with respect to address inputs A8, A10 and BA0.

Accordingly, when the configuration logic 42 inputs the address inputs, if the device width set mode is enabled, the configuration logic 42 decodes the other address inputs according to predetermined device width encodation definitions to determine the device width. The configuration logic 42 then configures the data control circuit 20, the latch circuit 24, and the input/output buffer 26 according to the determined device width.

Figure 6:
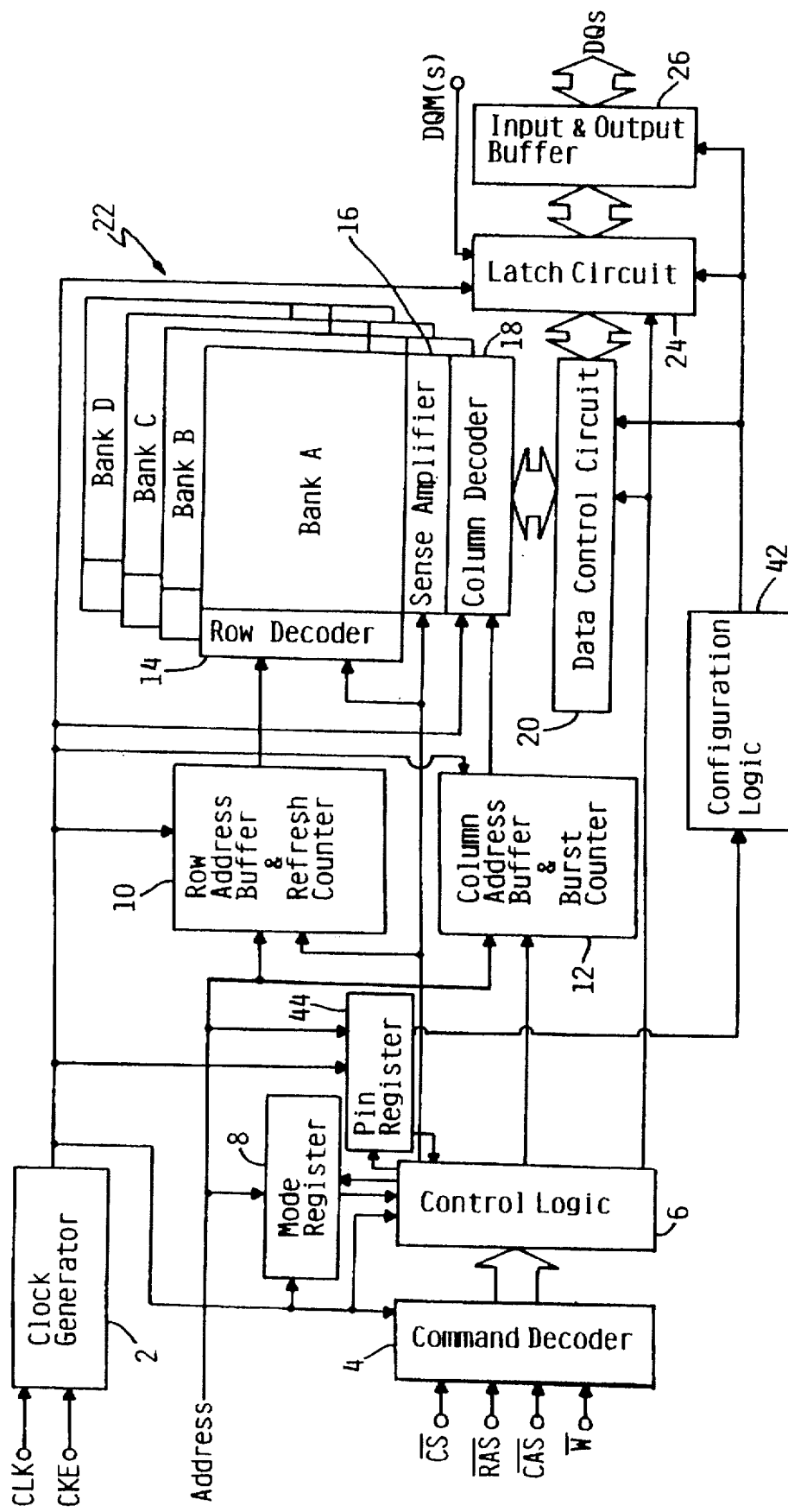
FIG. 6 illustrates an SDRAM having a programmable device width according to another embodiment of the present invention.

FIG. 6 illustrates an SDRAM having a programmable device width according to another embodiment of the present invention. The SDRAM of FIG. 6 is the same as the SDRAM of FIG. 3 except that a device width register 44 has been added, and the configuration logic 42 is connected to the device width register 44 instead of the mode register 8. As shown in FIG. 6, the device width register 44 receives the address inputs and is connected to the control logic 6 in the same manner as mode register 8. The SDRAM of FIG. 6 functions in the same manner as discussed above with respect to the SDRAM of FIG. 3 except for the setting of the device width.

The operation of the embodiment illustrated in FIG. 6 will now be described. In this embodiment, one of the address inputs A8, A10, and BA0-BA1 is used to enable a second mode register set cycle. When enabled, the control logic 6 expects a second mode register set cycle. Therefore, the control logic 6 causes the device width register 44 to, at the next clock cycle, latch the address data on the address inputs A0-A10 and BA0-BA1. The address inputs A0-A10 and BA0-BA1 of the second mode register set cycle are used to set the device width. In other words, either through direct or indirect encodation, the address inputs latched by the device width register 44 specify the device width.

For example, according to predetermined device width encodation definitions, address inputs A0-A2 are used to directly or indirectly encode the device width in the same manner illustrated in FIGS. 4-5 with respect to address inputs A8, A10 and BA0. The configuration logic 42 decodes the data latched by the device width register 44 according to the predetermined device width encodation definitions, and based on the device width enabled, configures the device width accordingly. This configuration is performed in the same manner as discussed above with respect to the configuration logic 28.

The address inputs used to specify the device width and the type of encodation, direct or indirect encodation, can easily be changed by changing the device width encodation definitions. Consequently, the present invention is not limited to the device width encodation definitions discussed above, but instead, the device width encodation definitions are freely selectable.

Figure 7:
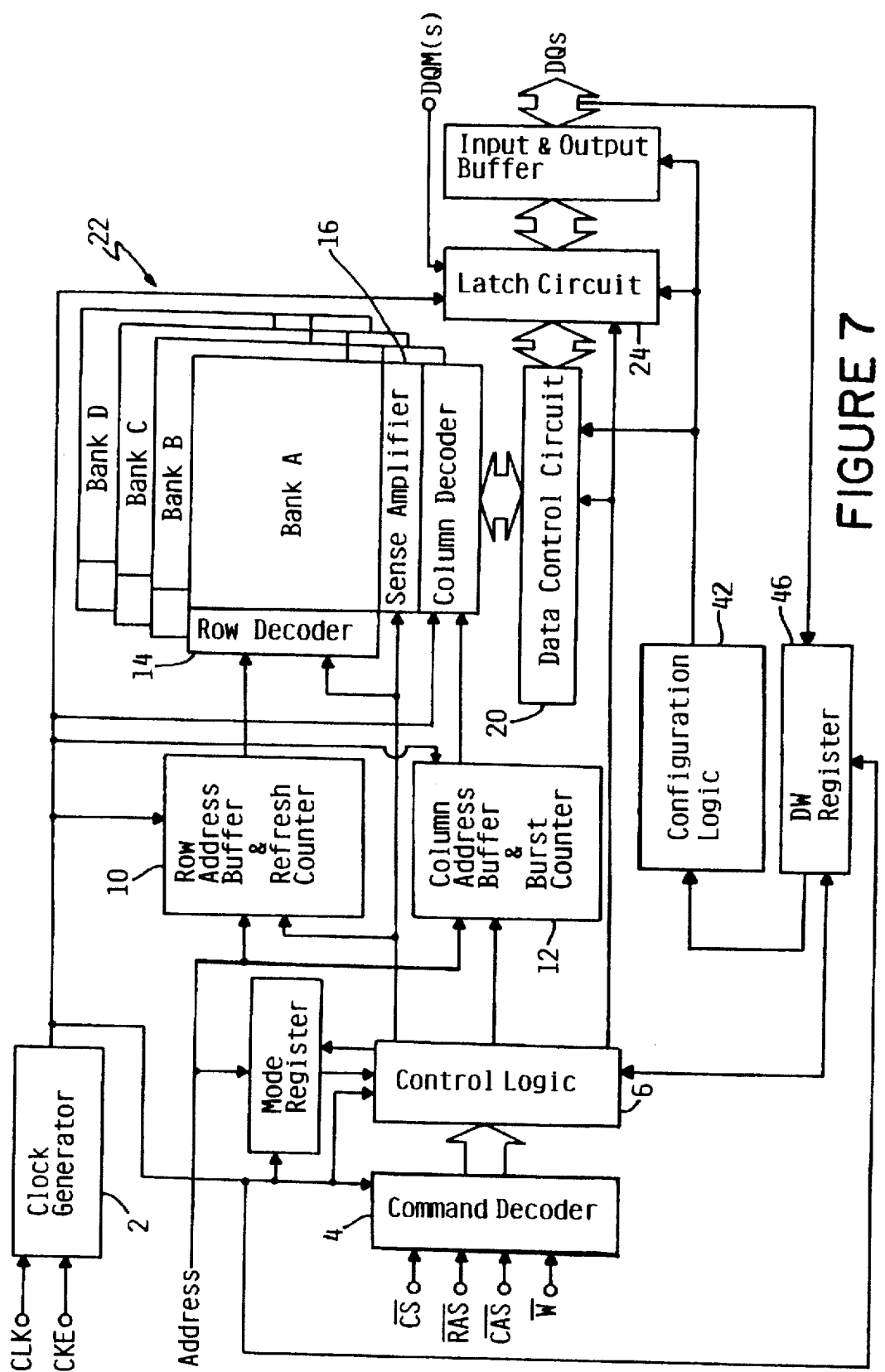
FIG. 7 illustrates an SDRAM having a programmable device width according to yet another embodiment of the present invention.

FIG. 7 illustrates an SDRAM having a programmable device width according to yet another embodiment of the present invention. The SDRAM of FIG. 7 is the same as the SDRAM of FIG. 3 except that (1) a device width register 46 has been added, and (2) the configuration logic 42 is connected to the device width register 46 instead of the mode register 8. As shown in FIG. 7, the device width register 46 is connected to the input/output pins DQs in the same manner the mode register 8 is connected to the address inputs. The device width register 46 is also connected to the control logic 6 in the same manner as the mode register 8. The SDRAM of FIG. 7 functions in the same manner as discussed above with respect to the SDRAM of FIG. 3 except for the setting of the device width.

The operation of the embodiment illustrated in FIG. 7 will now be described. In this embodiment, one of the address inputs A8, A10, and BA0–BA1 is used to enable a second mode register set cycle. When enabled, the control logic 6 expects a second mode register set cycle. Therefore, the control logic 6 causes the device width register 46 to, at the next clock cycle, latch the data on input/output pins DQs. The input/output pins DQs in the second mode register set cycle are used to set the device width. In other words, either through direct or indirect encodation, the input/output pins DQs latched by the device width register 46 specify the device width. For example, according to predetermined device width encodation definitions, input/output pins DQ0–DQ2 could be used to directly or indirectly encode the device width in the same manner illustrated in FIGS. 4–5 with respect to address inputs A8, A10 and BA0, respectively. The configuration logic 42 decodes the latched data according to the predetermined device width encodation definitions, and based on the device width enabled, configures the device width accordingly. This configuration is performed in the same manner as discussed above with respect to the configuration logic 28.

The input/output pins DQs used to specify the device width and the type of encodation, direct or indirect encodation, can easily be changed by changing the device width encodation definitions. Consequently, the present invention is not limited to the device width encodation definitions discussed above, but instead, the device width encodation definitions are freely selectable.

As this embodiment demonstrates, the device width can be specified using other inputs and outputs than the address inputs. Furthermore, as discussed in more detail below with respect to other types of memory devices, the device width set mode need not be enabled via the address inputs or during a mode register set operation. For instance, a unique sequence and/or combination of command inputs could be used to enable the device width set mode.

Furthermore, while the techniques and methodologies of programming device width have been discussed above with respect to SDRAMs, the present invention is not limited to these memory devices. As discussed in detail below, the techniques discussed above with respect to the embodiments of FIG. 6 and FIG. 7 can also be applied to DRAMs, ROMs, PROMs, EPROMs, EEPROMs, etc. These memory devices do not have a mode register set operation like SDRAMs; and hence do not have a mode register. Yet, as discussed in detail below, a device width set mode can be established.

With respect to DRAMs, illustrated in the embodiments of FIGS. 6 and 7 with respect to SDRAMs, a device width register is added to the DRAMs and connected to the configuration logic, control logic and the address inputs or other data inputs or outputs of the DRAM in the same manner as discussed above with respect to the embodiments of FIGS. 6 and 7. The operation of the DRAM embodiments will now be described.

As the discussion above indicates, DRAMs do not have a mode register set operation. DRAMs do, however, have undefined commands. In other words, combinations and/or sequences of $\overline{CS}$, $\overline{CAS}$, $\overline{RAS}$ and $\overline{W}$ have not been assigned a command. In page mode DRAMs this technique has been used to establish a test mode. When the page mode DRAM receives $\overline{W}$ and $\overline{CAS}$ active when $\overline{RAS}$ goes active, the page mode DRAM enters a test mode. Similarly, combinations of commands and/or a predefined sequence of commands, can be used to establish a device width set mode. Accordingly, once the device width set mode is enabled, the control logic causes the device width register to latch the address inputs or other inputs and outputs, and the device width is set either through direct or indirect encodation as discussed above with respect to the embodiments of FIGS. 6–7. Namely, the configuration logic of the DRAM decodes the data latched by the device width register according to the device width encodation definitions, and based on the device width decoded, configures the device width accordingly.

As a further alternative, the device width register could be used to establish the device width set mode as discussed above with respect to the second method of operation of the embodiment illustrated in FIG. 3. Setting of the test mode in page mode DRAMs does not depend on whether a particular address input has been enabled. Following the techniques discussed above with respect to the second method of operation of the embodiment illustrated in FIG. 3, however, the address inputs can be used to enable either the test mode or the device width set mode. For instance, after receiving the predetermined command sequence of $\overline{W}$ and $\overline{CAS}$ active when $\overline{RAS}$ goes active, the device width register latches, for example, the address inputs. To enter the test mode, i.e., to enable the test mode, then requires that one of the address inputs be in a predetermined logical state. Likewise, another address input is used to enable the device width set mode. In the device width set mode, the device width is then set either through direct or indirect encodation using the remaining address inputs.

The configuration logic of the DRAM decodes the data latched by the device width register according to predetermined device width encodation definitions, and based on the device width decoded, configures the device width accordingly.

Furthermore, these techniques can also be applied to ROMS, PROMs, EPROMS, EEPROMs, etc. As illustrated in the embodiments of FIGS. 6 and 7 with respect to SDRAMs, a device width register is added to the ROMs, PROMs, EPROMs, EEPROMs, etc. and connected to the configuration logic, control logic, and the address inputs or other data inputs or outputs in the same manner as discussed above with respect to the embodiments of FIGS. 6 and 7. The operation of these embodiments will now be described.

These memory devices have a chip enable $\overline{CE}$ input, and output enable $\overline{OE}$ output, address inputs, and at least one data output, but do not have a plurality of command inputs like SDRAMs and DRAMs. Even so, the device width set mode can be established using a unique timing sequence. For instance, one possible method to establish the device width set mode is to use an abbreviated read timing.

Figure 8:
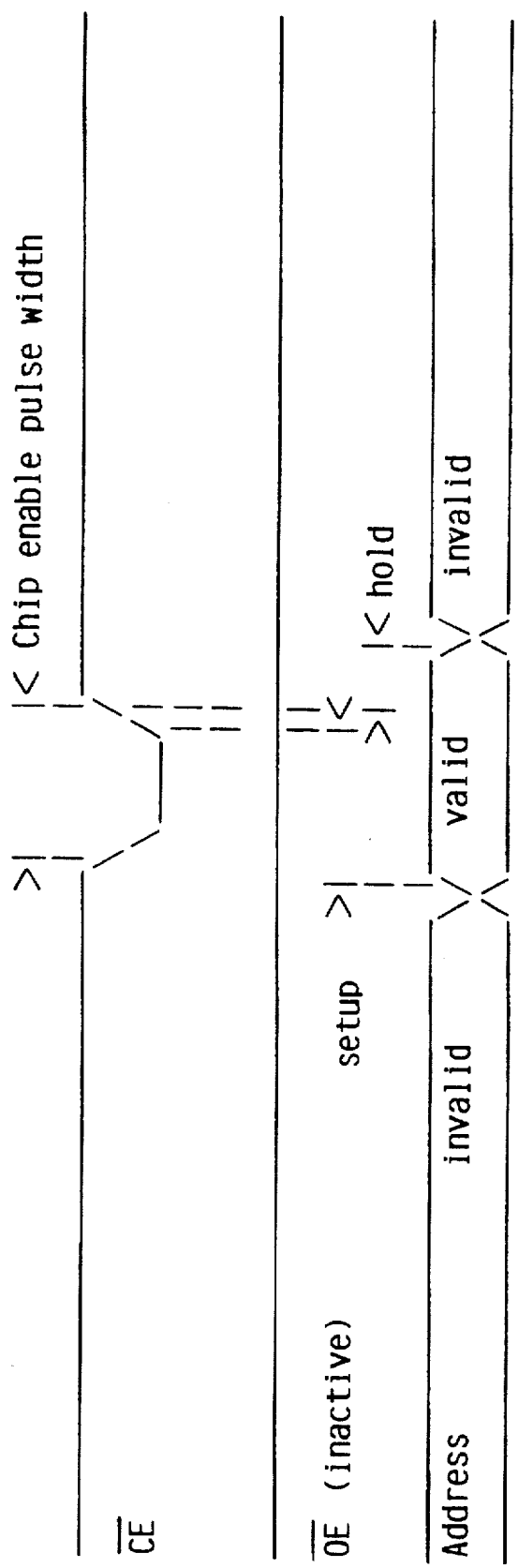
FIG. 8 illustrates a timing sequence for identifying a device width set operation.

Specifically, if the memory device were activated with the $\overline{CE}$ to initiate a read cycle, but the read cycle was too short to guarantee valid data, then the control logic establishes the device width set mode. This timing sequence for establishing a device width set mode is illustrated in FIG. 8. As shown in FIG. 8, the CE is enabled to initiate a read cycle. If CE remains enabled for a predetermined period of time, the data on the address inputs are determined to be valid, and, therefore, input to address a memory location. If, however, as shown in FIG. 8, CE does not remain enabled for the predetermined period of time, the data on the address inputs are determined invalid. When this occurs while OE is not enabled, the control logic enters the device width set mode.

Accordingly, the control logic would cause the device width register to latch the address inputs or the data outputs depending on whether the embodiment of FIG. 6 or FIG. 7 were being implemented. The device width is then set either through direct or indirect encodation. Specifically, the configuration logic of the ROMs, PROMs, EPROMs, EEPROMs, etc., decodes the data latched by the device width register according to predetermined device width encodation definitions, and based on the device width decoded, configures the device width accordingly.

While the embodiments of the present invention discussed above use the configuration logic of the memory device to decode the device width using predetermined encodation definitions, the control logic of the memory device could be modified to perform this decoding operation. The control logic would then output the decoded desired device width to the configuration logic. Additionally, separate decode logic could be provided.

As discussed above, the present invention provides memory devices and associated techniques for programming the device width thereof. Accordingly, the present invention provides the consumer with the flexibility of choosing the device width.

The present invention also allows the manufacturer to replace a plurality of different memory devices with a single memory device having multiple, programmable device widths. Accordingly, the manufacturer can replace numerous part numbers with a single part number. Consumers no longer need wade through long lists of device part numbers to find the particular memory device having the device width desired.

The present invention further allows manufacturers to simultaneously satisfy the demand for both popular and less popular device widths. Consumers of less popular device widths will therefore benefit from the readily available supply of their desired device.

The memory device having a programmable device width according to the present invention does not require changing the number of pins of the resulting device. Therefore, the memory device having a programmable device width according to the present invention meets JEDEC packaging standards.

While the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

I claim:

1. A memory device having a programmable device width, comprising:

a memory storing data;

output logic outputting data from said memory based on control signals and address data received on address inputs;

a register storing at least device width data;

control logic receiving command data, generating said control signals based on said command data, and controlling said register to store said device width data based on said command data; and decoding means for decoding said device width data to determine a desired device width; and configuration logic configuring said output logic so that said memory device has said desired device width.

2. The memory device of claim 1, wherein said control logic causes said register to store said device width data when said control logic identifies a predetermined combination of commands included in said command data.

3. The memory device of claim 1, wherein said control logic causes said register to store device width data when said control logic identifies a predetermined sequence of commands included in said command data.

4. The memory device of claim 1, wherein said control logic causes said register to store device width data when said control logic identifies a predetermined timing sequence of commands included in said command data.

5. The memory device of claim 1, wherein said register latches data on said address inputs as said device width data.

6. The memory device of claim 1, wherein said output logic includes at least one output; and said register latches data on said output as said device width data.

7. The memory device of claim 1, wherein said decoding means decodes selected bits stored in said register to determine said desired device width.

8. The memory device of claim 7, wherein each one of said selected bits represents a different device width, and said decoding means determines said device width based on which one of said selected bits is set.

9. The memory device of claim 1, wherein said decoding means determines if a predetermined bit stored by said register is enabled, and if enabled, said decoding means decodes selected bits stored in said register to determine said device width.

10. The memory device of claim 9, wherein each one of said selected bits represents a different device width, and said decoding means determines said device width based on which one of said selected bits is set.

11. The memory device of claim 1, wherein said memory device is a synchronous dynamic random access memory.

12. The memory device of claim 11, wherein said register is a mode register.

13. The memory device of claim 12, wherein said control logic causes said mode register to latch address input bits on said address inputs when said control logic identifies a mode register set command included in said command data.

14. The memory device of claim 13, wherein said decoding means decodes selected address input bits stored in said mode register to determine said desired device width.

15. The memory device of claim 14, wherein each one of said selected address input bits represents a different device width, and said decoding means determines said device width based on which one of said selected address input bits is set.

16. The memory device of claim 12, wherein said decoding means determines if a predetermined address input bit latched by said mode register is enabled, and if enabled, said decoding means decodes selected address input bits stored in said mode register to determine said device width.

17. The memory device of claim 16, wherein each one of said selected address input bits represents a different device width, and said decoding means determines said device width based on which one of said selected address input bits is set.

18. The memory device of claim 1, further comprising:
a mode register latching said address inputs; and wherein
said control logic causes said mode register to latch address input bits on said address inputs when said control logic identifies a mode register set command include in said command data.

19. The memory device of claim 18, wherein
said control logic causes said register to store said device width data based on a polarity of a predetermined address bit stored in said mode register.

20. The memory device of claim 1, wherein said memory device is a dynamic random access memory.

21. The memory device of claim 1, wherein said memory device is one of a read only memory, programmable read only memory, erasable read only memory, and electrically erasable read only memory.

22. A method of programming a device width of a memory device which includes storage means for storing data, output means for outputting data from said storage means based on control signals and address data received on address inputs, register means for at least storing device width data, control means for receiving command data, generating said control signals based on said command data, and controlling said register means to store said device width data based on said command data, decoding means for decoding said device width data to determine a desired device width, and configuring means for configuring said output means so that said memory device has said desired device width, comprising:
(a) supplying command data to said control means such that said control means causes said register means to store device width data; and
(b) supplying device width data representing a desired device width to said register means.

23. The method of claim 22, wherein said step (a) supplies a predetermined combination of commands.

24. The method of claim 22, wherein said step (a) supplies a predetermined sequence of commands.

25. The method of claim 22, wherein said step (a) supplies a predetermined timing sequence of commands.

26. The method of claim 22, wherein said step (b) supplies said device width data on said address inputs.

27. The method of claim 22, wherein said output means includes at least one output, and wherein
said step (b) supplies said device width data on said output.

28. The method of claim 22, wherein said memory device is one of a synchronous dynamic random access memory, a dynamic random access memory, a read only memory, programmable read only memory, an erasable read only memory, and an electrically erasable read only memory.

29. A method of setting a device width for a memory device which includes storage means for storing data, output means for outputting data from said storage means based on control signals and address data received on address inputs, a register means for at least storing device width data, said method comprising:
(a) receiving command data;
(b) generating said control signals based on said command data;
(c) controlling said register means to store said device width data based on said command data;
(d) decoding said device width data to determine a desired device width; and (e) configuring said output means so that said memory device has said desired device width.

30. The method of claim 29, wherein said step (c) includes the substeps of (c1) determining whether said command data includes a predetermined combination of commands, and (c2) causing said register means to store said device width data when said step (c1) identifies said predetermined combination of commands in said command data.

31. The method of claim 29, wherein said step (c) includes the substeps of (c1) determining whether said command data includes a predetermined sequence of commands, and (c2) causing said register means to store said device width data when said step (c1) identifies said predetermined sequence of commands in said command data.

32. The method of claim 29, wherein said step (c) includes the substeps of (c1) determining whether said command data includes a predetermined timing sequence of commands, and (c2) causing said register means to store said device width data when said step (c1) identifies said predetermined timing sequence of commands in said command data.

33. The method of claim 29, further comprising: (f) latching, with said register means, data on said address inputs as said device width data.

34. The method of claim 29, wherein said output means includes at least one output, and further comprising:
(f) latching, with said register means, data on said output as said device width data.

35. The method of claim 29, wherein said step (d) decodes selected bits stored in said register means to determine said desired device width.

36. The method of claim 35, wherein each one of said selected address input bits represents a different device width, and said step (d) determines said device width based on which one of said selected bits is set.

37. The method of claim 29, wherein said step (d) includes the substeps of (d1) determining if a predetermined bit stored by said register means is enabled, and (d2) if said predetermined bit is enabled, decoding selected bits stored in said register means to determine said device width.

38. The method of claim 37, wherein each one of said selected address input bits represents a different device width, and said step (d) determines said device width based on which one of said selected bits is set.

39. The method of claim 29, wherein said memory device is a synchronous dynamic random access memory.

40. The method of claim 39, wherein said register means is a mode register.

41. The method of claim 40, wherein said step (c) includes the substeps of (c1) determining whether said command data includes a mode register set command, and (c2) causing said mode register to latch address input bits from said address inputs when said step (c1) identifies a mode register set command.

42. The method of claim 41, wherein said step (d) decodes selected address input bits stored in said mode register to determine said desired device width.

43. The method of claim 42, wherein each one of said selected address input bits represents a different device width, and said step (d) determines said device width based on which one of said selected address input bits is set.

44. The method of claim 40, wherein said step (d) includes the substeps of (d1) determining if a predetermined address input bit latched by said mode register is enabled, and (d2) if said predetermined address bit is enabled, decoding selected address input bits stored in said mode register to determine said device width.

45. The method of claim 44, wherein each one of said selected address input bits represents a different device width, and said step (d2) determines said device width based on which one of said selected address input bits is set.

46. The method of claim 29, further comprising:
   (g) latching address bits on said address inputs using a mode register; and
   (h) determining whether said command data includes a mode register set command; and
   (i) controlling said mode register to latch said address inputs when said step (h) determines that said command data includes said mode register set command.

47. The method of claim 46, wherein
said step (c) causes said register means to store said device width data based on a polarity of a predetermined address bit stored in said mode register.

48. The method of claim 29, wherein said memory device is a dynamic random access memory.

49. The method of claim 29, wherein said memory device is one of a read only memory, programmable read only memory, erasable read only memory, and electrically erasable read only memory.

50. A memory device having a programmable device width, comprising:
   storage means for storing data;
   output means for outputting data from said storage means based on control signals and address data received on address inputs;
   register means for storing at least device width data;
   control means for receiving command data, generating said control signals based on said command data, and controlling said register means to store said device width data based on said command data; and
   decoding means for decoding said device width data to determine a desired device width; and
   configuring means for configuring said output means so that said memory device has said desired device width.

51. The memory device of claim 50, wherein said control means causes said register means to store said device width data when said control means identifies a predetermined combination of commands included in said command data.

52. The memory device of claim 50, wherein said control means causes said register means to store device width data when said control means identifies a predetermined sequence of commands included in said command data.

53. The memory device of claim 50, wherein said control means causes said register means to store device width data when said control means identifies a predetermined timing sequence of commands included in said command data.

54. The memory device of claim 50, wherein said register means latches data on said address inputs as said device width data.

55. The memory device of claim 50, wherein
said output means includes at least one output; and
said register means latches data on said output as said device width data.

56. The memory device of claim 50, wherein said decoding means decodes selected bits stored in said register means to determine said desired device width.

57. The memory device of claim 56, wherein each one of said selected bits represents a different device width, and said decoding means determines said device width based on which one of said selected bits is set.

58. The memory device of claim 50, wherein said decoding means determines if a predetermined bit stored by said register means is enabled, and if enabled, said decoding means decodes selected bits stored in said register means to determine said device width.

59. The memory device of claim 58, wherein each one of said selected bits represents a different device width, and said decoding means determines said device width based on which one of said selected bits is set.

* * * * *